United States Patent
Kawashimo

(10) Patent No.: US 6,530,512 B2
(45) Date of Patent: Mar. 11, 2003

(54) WIRE BONDING APPARATUS AND WIRE BONDING METHOD

(75) Inventor: Hiroshi Kawashimo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/878,389

(22) Filed: Jun. 12, 2001

(65) Prior Publication Data
US 2002/0066773 A1 Jun. 6, 2002

(30) Foreign Application Priority Data
Dec. 5, 2000 (JP) ........................................ 2000-369503

(51) Int. Cl.⁷ ............................ B23K 37/04; B23K 31/02
(52) U.S. Cl. ...................................... 228/4.5; 228/180.5
(58) Field of Search .......................... 228/180.5, 4.5, 228/110.1, 1.1

(56) References Cited

U.S. PATENT DOCUMENTS

| | | | |
|---|---|---|---|
| 5,201,450 A | * | 4/1993 | Ahn |
| 5,307,977 A | * | 5/1994 | Park |
| 5,307,978 A | * | 5/1994 | Ricketson et al. |
| 6,070,780 A | * | 6/2000 | Shimura et al. |
| 6,099,678 A | * | 8/2000 | Kotato et al. |
| 6,110,805 A | * | 8/2000 | Schrock et al. |
| 6,302,317 B1 | * | 10/2001 | Narita et al. |

FOREIGN PATENT DOCUMENTS

| | | | |
|---|---|---|---|
| JP | 363025937 A | * | 2/1988 |
| JP | 63-80544 A | | 4/1988 |
| JP | 401231335 A | * | 9/1989 |
| JP | 401241837 A | * | 9/1989 |
| JP | 403206631 A | * | 9/1991 |
| JP | 407161757 A | * | 6/1995 |
| JP | 11-74306 A | | 3/1999 |

* cited by examiner

Primary Examiner—Tom Dunn
Assistant Examiner—Kiley Stoner
(74) Attorney, Agent, or Firm—Leydig, Voit & Mayer, Ltd.

(57) ABSTRACT

A wire bonding apparatus for connecting a metal fine wire at a normal position on a bonding pad of an IC chip so that there will be no variations in the positions of a die pad and the IC chip at the time of bonding. A platen is disposed on a heat block in accordance with the shape of an IC lead frame for enlarging a heat transfer surface for transferring heat to the lead frame. A heater and a preheater for preheating an IC chip that is to be heated next by the heater are disposed on a surface of the platen.

6 Claims, 4 Drawing Sheets

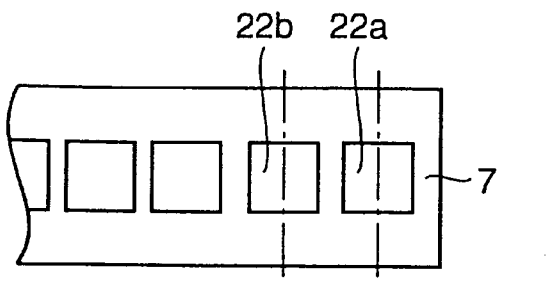
FIG. 1A
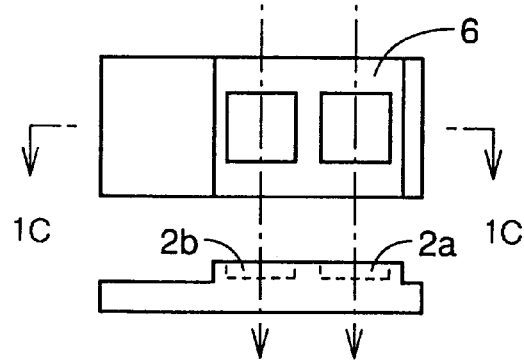
FIG. 1B
FIG. 1C
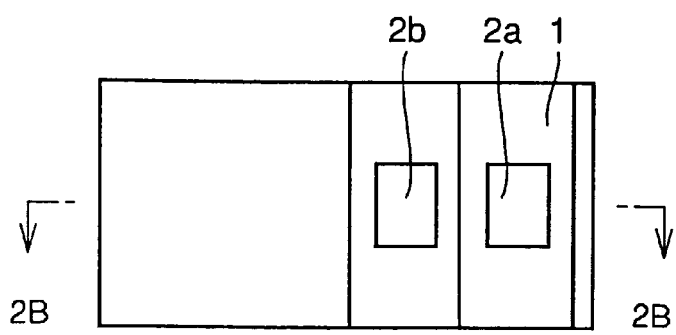
FIG. 2A
FIG. 2B
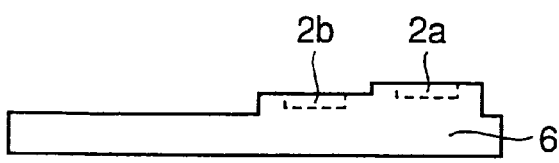

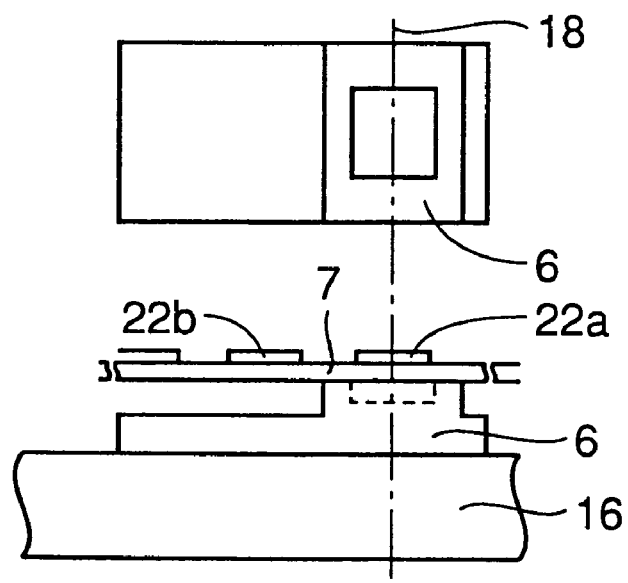
FIG. 7 A
PRIOR ART
FIG. 7 B
PRIOR ART
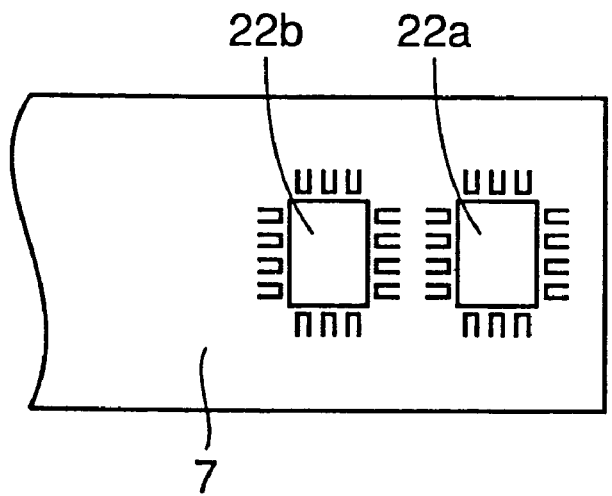
FIG. 8
PRIOR ART

WIRE BONDING APPARATUS AND WIRE BONDING METHOD

BACKGROUND OF THE INVENTION

1. Field of the Invention

The present invention generally relates to a wire bonding apparatus, and more particularly to a wire bonding apparatus which is improved so as to be capable of reducing a sudden heat expansion of an IC (Integrated Circuit) lead frame. The present invention also relates to a wire bonding method which is improved so as to be capable of reducing a sudden heat expansion of an IC lead frame.

2. Description of the Background Art

FIG. 5 is a plan view of a bonding part of a semiconductor device.

Referring to FIG. 5, there is hitherto a step of mounting an IC chip 1 on an IC lead frame and connecting a bonding pad 2 on the IC chip 1 and an inner lead 4 of the IC lead frame with the use of a metal fine wire 5 to establish an electrical connection between the IC chip 1 and the inner lead 4. At that time, the IC chip 1 on a die pad 3 and the inner lead 4 on the IC lead frame are heated with a heater to carry out wire bonding. This step is carried out in a wire bonding apparatus.

FIGS. 6A and 6B are views schematically illustrating a platen used in a conventional wire bonding apparatus. FIG. 6A is a plan view and FIG. 6B is a cross section view. FIG. 7A is a plan view illustrating the manner in which an IC lead frame is heated with a platen, and FIG. 7B is a cross section view thereof. FIG. 8 is a plan view of an IC lead frame.

Referring to these drawings, a conventional wire bonding apparatus includes a heat block 16. A platen 6 that accords with the shape of an IC lead frame 7 is disposed on the heat block 16. Die pads 22a, 22b are disposed on the IC lead frame 7. A bonding point 2a is disposed in the platen 6. Only an IC chip mounted on the die pad 22a and an inner lead 4 of a corresponding IC lead frame, which are at a bonding position 18 on the platen 6, are heated.

This method generates an inconvenience such that, particularly in the case where the material of the IC lead frame 7 is copper, the IC lead frame 7 expands by heat to cause variations in the die pad position at the time of wire bonding. Variations in the die pad position cause variations in the position of the IC chip mounted on the die pad as well. Therefore, with the position of the IC chip shifted, the bonding pad of the IC chip and the inner lead of the IC lead frame are connected with a metal fine wire, thereby raising a problem in that the metal fine wire is not connected at a normal position on the bonding pad of the IC chip.

The present invention has been made in order to solve the aforesaid problem, and an object thereof is to provide a wire bonding apparatus which is improved so that the metal fine wire is connected at a normal position on the bonding pad of the IC chip.

Another object of the present invention is to provide a wire bonding method which is improved so that the metal fine wire is connected at a normal position on the bonding pad of the IC chip.

SUMMARY OF THE INVENTION

The invention according to the first aspect of the present invention is directed to a wire bonding apparatus for connecting an inner lead of an IC lead frame and an IC chip mounted on the IC lead frame with a metal fine wire. The wire bonding apparatus includes a heat block that heats the IC chip and the IC lead frame. A platen is disposed on the heat block in accordance with a shape of the IC lead frame for enlarging a heat transfer surface. A heating part for heating the IC chip and a preheating part for preheating an IC chip that is to be heated next are disposed on a surface of the platen.

According to this invention, an IC chip and an inner lead that are located prior to the bonding position by one pitch can be heated in the same manner as an IC chip and an inner lead that are located at the bonding position, thereby allowing the heat expansion of the IC lead frame to be saturated before bonding. Therefore, there will be no variations in the positions of the die pad and the IC chip at the time of bonding. As a result, the metal fine wire can be bonded at a normal position on the bonding pad of the IC chip.

In a wire bonding apparatus according to the second aspect of the present invention, a height of a surface of the preheating part is selected so that a gap between the IC lead frame and the preheating part will be from 0 to 1 mm.

According to this invention, sudden heating of the IC lead frame can be prevented.

In a wire bonding apparatus according to the third aspect of the present invention, the preheating part is constructed to be separable from the platen.

According to this invention, the preheating part can be replaced with a variety of other preheating parts, so that the gap between the IC lead frame and the preheating part can be changed in various ways.

In a wire bonding apparatus according to the fourth aspect of the present invention, a height of the preheating part is selected so that a gap between the IC lead frame and the preheating part will be within a range from 0 to 1 mm.

According to this invention, sudden heating of the IC lead frame can be prevented.

In a wire bonding apparatus according to the fifth aspect of the present invention, the preheating part is made adjustable so that a height of a gap between the IC lead frame and the preheating part will change within a range from 0 to 1 mm in the wire bonding apparatus according to the fourth aspect.

According to this invention, sudden heating of the IC lead frame can be prevented.

A method according to the sixth aspect of the present invention is directed to a wire bonding method for connecting an inner lead of an IC lead frame and an IC chip mounted on the IC lead frame with a metal fine wire. First, an IC lead frame and an IC chip are connected with a metal fine wire while heating the IC chip (first step). Simultaneously with heating the IC chip, an IC chip that is to be heated next is preheated (second step).

According to this invention, since the IC chip which is to be heated next is preheated, the heat expansion of the IC lead frame can be saturated before bonding. Therefore, there will be no variations in the positions of the die pad and the IC chip at the time of bonding. As a result, the metal fine wire can be bonded at a normal position on the bonding pad of the IC chip.

In the method according to the seventh aspect of the present invention, the heating in the second step is carried out with a weaker power than the heating in the first step.

According to this invention, sudden heating of the IC lead frame can be prevented. In particular, oxidation of the IC lead frame can be restrained.

The foregoing and other objects, features, aspects and advantages of the present invention will becomes more apparent from the following detailed description of the present invention when taken in conjunction with the accompanying drawings.

BRIEF DESCRIPTION OF THE DRAWINGS

FIGS. 1A to 1C are views for describing a structure of a platen used in a wire bonding apparatus according to a first embodiment;

FIGS. 2A and 2B are a plan view and a cross section view of a platen used in a wire bonding apparatus according to a second embodiment;

FIGS. 7A and 7B are a plan view and a cross section view illustrating the manner in which an IC lead frame is heated with the use of a conventional platen; and FIG. 8 is a plan view of a conventional IC lead frame.

DESCRIPTION OF THE PREFERRED EMBODIMENTS

Figure 3:
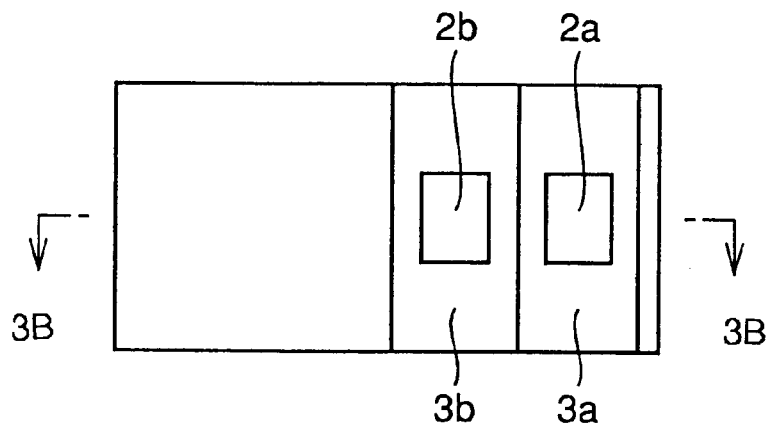
FIGS. 3A and 3B are a plan view and a cross section view of a platen used in a wire bonding apparatus according to a third embodiment.
Figure 3:
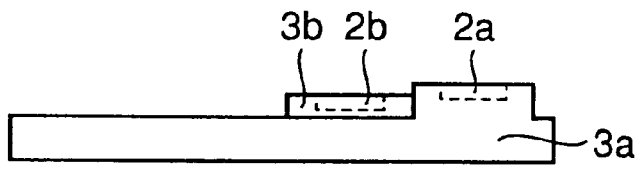

Hereafter, preferred embodiments of the present invention will be described with reference to the attached drawings.

First Embodiment

FIGS. 1A to 1C are views for describing a wire bonding apparatus according to the first embodiment of the present invention. FIG. 1A is a plan view of an IC lead frame. FIG. 1B is a plan view of a platen. FIG. 1C is a cross section view of the platen shown in FIG. 1B, taken along the line 1C—1C.

A platen 6 is disposed on a heat block (not illustrated). The platen 6 is provided with a bonding point 2a and a preheating point 2b integrally with the platen 6, in correspondence with a die pad 22a and a die pad 22b of the IC lead frame 7. The gap between the bonding point 2a and the preheating point 2b is the same as the gap between the die pad 22a and the die pad 22b of the IC lead frame 7.

The wire boding apparatus according to the first embodiment makes it possible to heat an IC chip and an inner lead located at the preheating point 2b, which is prior to the bonding point 2a by one pitch, in the same manner as the IC chip and the inner lead that are located at the bonding point 2a, thereby allowing the heat expansion of the IC lead frame to be saturated before bonding. Therefore, there will be no variations in the positions of the die pad and the IC chip at the time of bonding. As a result, the metal fine wire can be bonded at a normal position on the bonding pad of the IC chip.

Second Embodiment

FIG. 2A is a plan view of a platen according to the second embodiment of the present invention. FIG. 2B is a cross section view of the platen shown in FIG. 2A, taken along the line 2B—2B. Referring to these drawings, the plan view of the platen is similar to that of the first embodiment. However, the height of the upper surface of the preheating point 2b is positioned to be lower by 0 to 1 mm than the upper surface of the bonding point 2a.

With the use of the platen according to the second embodiment, the gap between the IC lead frame 7 and the preheating point 2b will be from 0 to 1 mm during the heating. Referring to FIGS. 2 and 8, this construction can saturate the heat expansion of the die pad 22b of the IC lead frame 7 at the preheating point 2b, so that when the die pad 22b comes to the bonding point 2a, the die pad 22b no longer expands, since the heat expansion is already completed. Therefore, there will be no variations in the position of the IC chip (not illustrated) mounted on the die pad 22b. Therefore, when the bonding pad (not illustrated) of the IC chip and a metal fine wire are wire-bonded at the bonding point 2a, the metal fine wire can be bonded at the normal position of the bonding pad without causing positional shifts. Since the height of the preheating point 2b is lower than the bonding point 2a, the heating at the preheating point 2b is carried out with a weaker power than the heating at the bonding point 2a, thereby restraining the sudden heating of the IC lead frame. In the case where the IC lead frame 7 is made of copper, this construction also produces an effect of restraining oxidation of the copper frame.

Third Embodiment

FIG. 3A is a plan view of a platen according to the third embodiment of the present invention. FIG. 3B is a cross section view of the platen shown in FIG. 3A, taken along the line 3B—3B.

In the platen according to the third embodiment, the platen body 3a and the preheating stage 3b are separately provided and are not integrated. Namely, the platen body 3a and the preheating stage 3b are made separable. The preheating stage 3b is mounted to the platen 3a in correspondence with the position of the die pad 22b of the IC lead frame 7.

The height of the preheating stage 3b is equal to the height of the bonding point 2a as in the first embodiment, or is made lower than the height of the bonding point 2a within a range of from 0 to 1 mm. The platen having this construction produces the same effect as the platen according to the first embodiment.

Fourth Embodiment

FIG. 4A is a plan view of a platen according to the fourth embodiment of the present invention. FIG. 4B is a cross section view of the platen shown in FIG. 4A, taken along the line 4B—4B.

Figure 4:
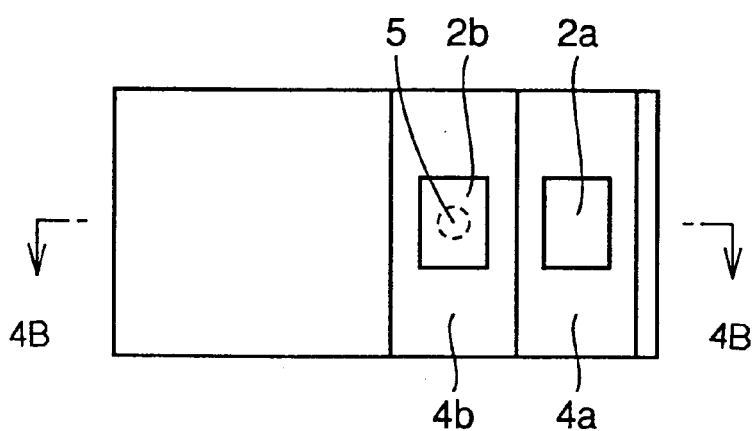
FIGS. 4A and 4B are a plan view and a cross section view of a platen used in a wire bonding apparatus according to a fourth embodiment.
Figure 4:
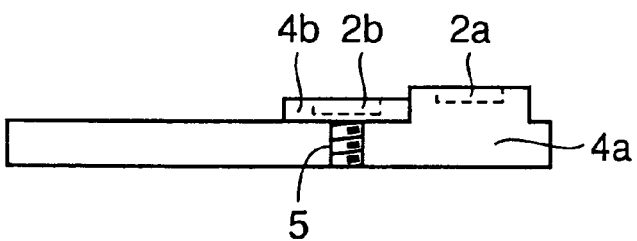
Figure 5:
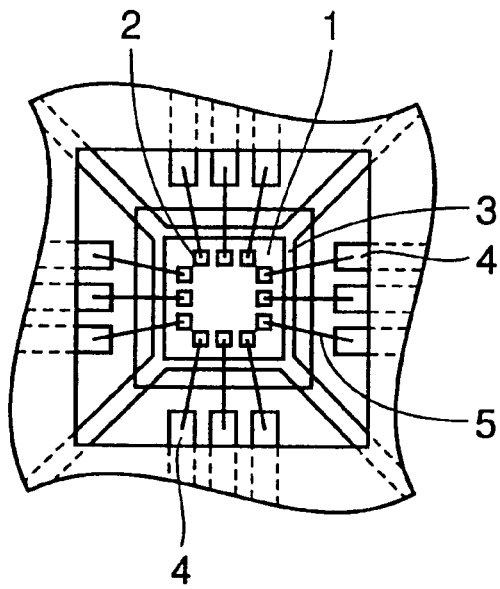
FIG. 5 is a plan view of a bonding part of a conventional semiconductor device.
Figure 6A:
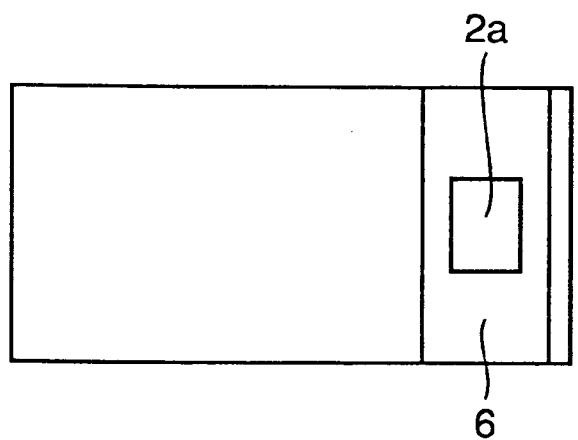
FIGS. 6A and 6B are a plan view and a cross section view of a platen used in a conventional wire bonding apparatus.
Figure 6B:

In the platen according to the fourth embodiment, the platen 4a and the preheating stage 4b are separately provided. Referring to FIGS. 4 and 8, the preheating stage 4b is mounted to the platen 4a in correspondence with the position of the die pad 22b of the IC lead frame 7. An adjustment hole 5 is disposed in the platen 4a at the position where the preheating stage 4b is to be mounted, so as to be capable of adjusting the height of the preheating stage 4b. By means of the adjustment hole 5, the height of the upper surface of the preheating stage 4b is made adjustable so as to be lower than the height of the upper surface of the bonding point 2a within a range of from 0 to 1 mm. Although only one adjustment hole 5 is illustrated in the drawings, the number of adjustment holes 5 may be any as long as the number is one or more. The platen having this construction also produces the same effect as the platen according to the first embodiment.

While the invention has been shown and described in detail, the foregoing description is in all aspects illustrative and not restrictive. It is therefore understood that numerous other modifications and variations can be devised without departing from the scope of the invention.

As described above, with the wire bonding apparatus according to the first aspect of the present invention, an IC chip and an inner lead that are located prior to the bonding position by one pitch can be heated in the same manner as an IC chip and an inner lead that are located at the bonding position, thereby allowing the heat expansion of the IC lead frame to be saturated before bonding. Therefore, there will be no variations in the positions of the die pad and the IC chip at the time of bonding. As a result, the metal fine wire can be bonded at a normal position on the bonding pad of the IC chip.

With the wire bonding apparatus according to the second aspect of the present invention, sudden heating of the IC lead frame can be prevented.

With the wire bonding apparatus according to the third aspect of the present invention, the preheating part can be replaced with a variety of other preheating parts, so that the gap between the IC lead frame and the preheating part can be changed in various ways.

With the wire bonding apparatus according to the fourth aspect of the present invention, sudden heating of the IC lead frame can be prevented.

With the wire bonding apparatus according to the fifth aspect of the present invention, sudden heating of the IC lead frame can be prevented.

By the wire bonding method according to the sixth aspect of the present invention, since the IC chip which is to be heated next is preheated, the heat expansion of the IC lead frame can be saturated before bonding. Therefore, there will be no variations in the positions of the die pad and the IC chip at the time of bonding. As a result, the metal fine wire can be bonded at a normal position on the bonding pad of the IC chip.

By the method according to the seventh aspect of the present invention, sudden heating of the IC lead frame can be prevented. In particular, oxidation of the IC lead frame can be restrained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wire bonding apparatus for connecting an IC lead frame and an IC chip mounted on the IC lead frame with a metal wire, the wire bonding apparatus including:
    a heat block;
    a platen disposed on the heat block as a heat transfer element and having a surface transferring heat to lead frames, the heat block heating the platen;
    a heating part on a first part of the surface of the platen for heating a first IC chip and a first IC lead frame, a first upper surface of the heating part having a shape conforming to the first IC lead frame; and
    a first preheating part on a second part of the surface of the platen and having a second upper surface for preheating a second IC chip and a second IC lead frame that are next to be heated by the heating part, wherein
        a third part of the surface of the platen has a third upper surface next to the first preheating part,
        the third upper surface is closer to the heat block than the second upper surface, and
        the second upper surface is closer to the heat block than the first upper surface.

2. The wire bonding apparatus according to claim 1, wherein the first preheating part is separable from the platen.

3. The wire bonding apparatus according to claim 1, wherein the second upper surface is spaced from the first IC lead frame by a gap of up to 1 mm.

4. The wire bonding apparatus according to claim 1, wherein the first preheating part is adjustable relative to the heat block so that a difference in position between the second upper surface and the first upper surface may be changed.

5. A wire bonding apparatus for connecting an IC lead frame and an IC chip mounted on the IC lead frame to a metal wire, the wire bonding apparatus including:
    a heat block;
    a platen having a surface and disposed on the heat block;
    a heating part on a first part of the surface of the platen and having a first upper surface for heating a first IC chip and a first IC lead frame, the first upper surface having a shape conforming to the first IC lead frame; and
    a preheating part on a second part of the surface of the platen and having a second upper surface for preheating a second IC chip and a second IC lead frame that are to be heated next by the heating part, the second upper surface having a shape conforming to the second IC lead frame, and the second upper surface being closer to the heat block than the first upper surface, wherein the preheating part is adjustable relative to the heat block so that a difference in position between the second upper surface and the first upper surface may be changed.

6. The wire bonding apparatus according to claim 5, wherein the preheating part is separable from the platen.

* * * * *